United States Patent
Song et al.

(10) Patent No.: US 9,160,357 B1
(45) Date of Patent: Oct. 13, 2015

(54) RESIDUAL ERROR SAMPLING AND CORRECTION CIRCUITS IN INL DAC CALIBRATIONS

(71) Applicant: QUALCOMM Incorporated, San Diego, CA (US)

(72) Inventors: Tongyu Song, San Diego, CA (US); Derui Kong, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 14/609,383

(22) Filed: Jan. 29, 2015

Related U.S. Application Data (60) Provisional application No. 61/986,861, filed on Apr. 30, 2014.

(51) Int. Cl.
| | |
|---|---|
| H03M 1/10 | (2006.01) |
| H03M 1/68 | (2006.01) |
| H03M 1/74 | (2006.01) |

(52) U.S. Cl.
CPC .......... *H03M 1/1047* (2013.01); *H03M 1/1057* (2013.01); *H03M 1/68* (2013.01); *H03M 1/742* (2013.01)

(58) Field of Classification Search
CPC .... H03M 1/1057; H03M 1/1009; H03M 1/10
See application file for complete search history.

(56) References Cited

U.S. PATENT DOCUMENTS

| | | | |
|---|---|---|---|
| 6,556,154 B1 | 4/2003 | Gorecki et al. | |
| 6,667,703 B1 | 12/2003 | Reuveni et al. | |
| 7,076,384 B1* | 7/2006 | Radulov et al. | 702/85 |
| 7,161,412 B1* | 1/2007 | Manganaro | 327/543 |
| 7,466,252 B1* | 12/2008 | Radulov et al. | 341/120 |
| 7,683,813 B2* | 3/2010 | Sugai | 341/120 |
| 7,898,449 B2 | 3/2011 | Kawahito et al. | |
| 8,179,295 B2 | 5/2012 | Ho et al. | |
| 8,536,899 B1* | 9/2013 | Lu et al. | 327/51 |
| 8,847,801 B2* | 9/2014 | Song | 341/120 |
| 2006/0158360 A1* | 7/2006 | Briaire | 341/144 |
| 2013/0176152 A1 | 7/2013 | Ali | |

FOREIGN PATENT DOCUMENTS

EP 0794535 A2 9/1997

OTHER PUBLICATIONS

Groeneveld D.W.J., et al., "A Self-Calibration Technique for Monolithic High-Resolution D/A Converters", IEEE Journal of Solid-State Circuits, Dec. 1989, vol. 24, No. 6, pp. 1517-1522, XP000100482, ISSN: 0018-9200, DOI: 10.1109/4.44987 figure 2.

International Search Report and Written Opinion—PCT/US2015/026237—ISA/EPO—Jul. 29, 2015.

* cited by examiner

*Primary Examiner* — Howard Williams
(74) *Attorney, Agent, or Firm* — Arent Fox LLP (57) ABSTRACT

In an aspect of the disclosure, a method and an apparatus are provided for calibrating a DAC. The apparatus calibrates a first DAC element, provides a residual current error resulting from the calibration, the residual current error being a difference between a calibrated current source of the first DAC element and a reference current source, stores the residual current error of the calibrated first DAC element in a first memory module using at least first and second storage elements coupled to a differential amplifier, and calibrates a second DAC element using the stored residual current error.

22 Claims, 10 Drawing Sheets

RESIDUAL ERROR SAMPLING AND CORRECTION CIRCUITS IN INL DAC CALIBRATIONS

CROSS-REFERENCE TO RELATED APPLICATIONS

This application claims the benefit of U.S. Provisional Application Ser. No. 61/986,861 entitled "RESIDUAL ERROR SAMPLING AND CORRECTION CIRCUITS IN INL DAC CALIBRATIONS" and filed on Apr. 30, 2014, which is expressly incorporated by reference herein in its entirety.

BACKGROUND

1. Field

Various aspects disclosed herein relate generally to methods and systems for digital-to-analog conversion. More specifically, this disclosure relates to methods and systems for calibrating a digital-to-analog converter (DAC).

2. Background

DACs are utilized in a wide variety of applications. DACs can be susceptible to various types of errors including, but not limited to, errors related to current or voltage source mismatches, gain and offset errors, as well as errors caused by external signal paths. To achieve improved performance in the areas of signal-to-noise and distortion ratio (SNDR), total harmonic distortion (THD), and spurious free dynamic range (SFDR), self-calibration techniques are utilized to calibrate the output provided by a DAC.

One self-calibration technique employs controllable current sources and a calibration circuit to tune current source values. The calibration circuit compares the current source value provided by a selected controllable current source to a reference current value and adjusts the controllable current source in accordance with the comparison. However, with such conventional self-calibration of current source values, DACs can be susceptible to large integral non-linearity (INL) errors across the bit elements of the DAC, which can result in large DAC performance variations. The large or unbounded INL errors can be due to calibration errors or variations. The calibration errors can be caused by finite calibration resolution, current comparator noise, and other issues.

According to another self-calibration technique, an analog-to-digital converter digitizes most significant bit (MSB) codes at the output of the DAC and compares the MSB codes to expected outputs to obtain errors which are stored for each code. The errors are used to drive the DAC and compensate for the errors. However, this ADC-based self-calibration technique requires an ADC with adequate resolution, which may significantly add to the silicon area and power consumption of the DAC.

SUMMARY

In an aspect of the disclosure, a method and an apparatus are provided for calibrating a DAC. The apparatus calibrates a first DAC element, provides a residual current error resulting from the calibration, the residual current error being a difference between a calibrated current source of the first DAC element and a reference current source, stores the residual current error of the calibrated first DAC element in a first memory module using at least first and second storage elements coupled to a differential amplifier, and calibrates a second DAC element using the stored residual current error.

DETAILED DESCRIPTION

The detailed description set forth below in connection with the appended drawings is intended as a description of various configurations and is not intended to represent the only configurations in which the concepts described herein may be practiced. The detailed description includes specific details for the purpose of providing a thorough understanding of various concepts. However, it will be apparent to those skilled in the art that these concepts may be practiced without these specific details. In some instances, well known structures and components are shown in block diagram form in order to avoid obscuring such concepts.

Certain aspects are directed to calibration error reduction methods and circuits. In one aspect, such a method is applied in a DAC (e.g., a controlled current source DAC) that includes a current comparator circuit configured to calibrate a current source associated with a DAC element. The disclosure is directed to residual current error sampling methods and correction circuits to achieve accurate DAC MSB INL calibrations. The proposed methods avoid circuit design issues, such as sampling switch charge injections and switch leakage issues, and may improve the calibration accuracy by enabling accurate residual error sampling for INL corrections. This technique may be implemented in 20 nm TxDAC.

To achieve good performance in a DAC, such as high SNDR, THD, and SFDR, accurate current source matching for each DAC element is need. In conventional DAC designs, accurate current source matching is typically achieved by using large transistor-based current sources. However, due to the limitation of the device sizes offered by available CMOS process technologies, acceptable current matching performance may not be achieved. To improve the accuracy of the current source matching, a self-calibration technique may be used to tune the different current source values of each DAC element to a desired level. Despite any additional circuitry that may be required for the calibration, due to the significant reduction of current source area, the total die area may decrease.

To improve DAC calibration accuracy, integral nonlinearity (INL) correction may be applied. In one approach, for example, the residual current error determined from a calibration of an nth MSB DAC element (also referred to as DAC bit element) may be sampled and stored. The residual current error may subsequently be used in the calibration of a successive (n+1)th MSB DAC element. Therefore, the calibrated (n+1)th MSB DAC element has an improved INL curve, and consequently, reduced calibration variations and improved DAC performance.

Figure 1:
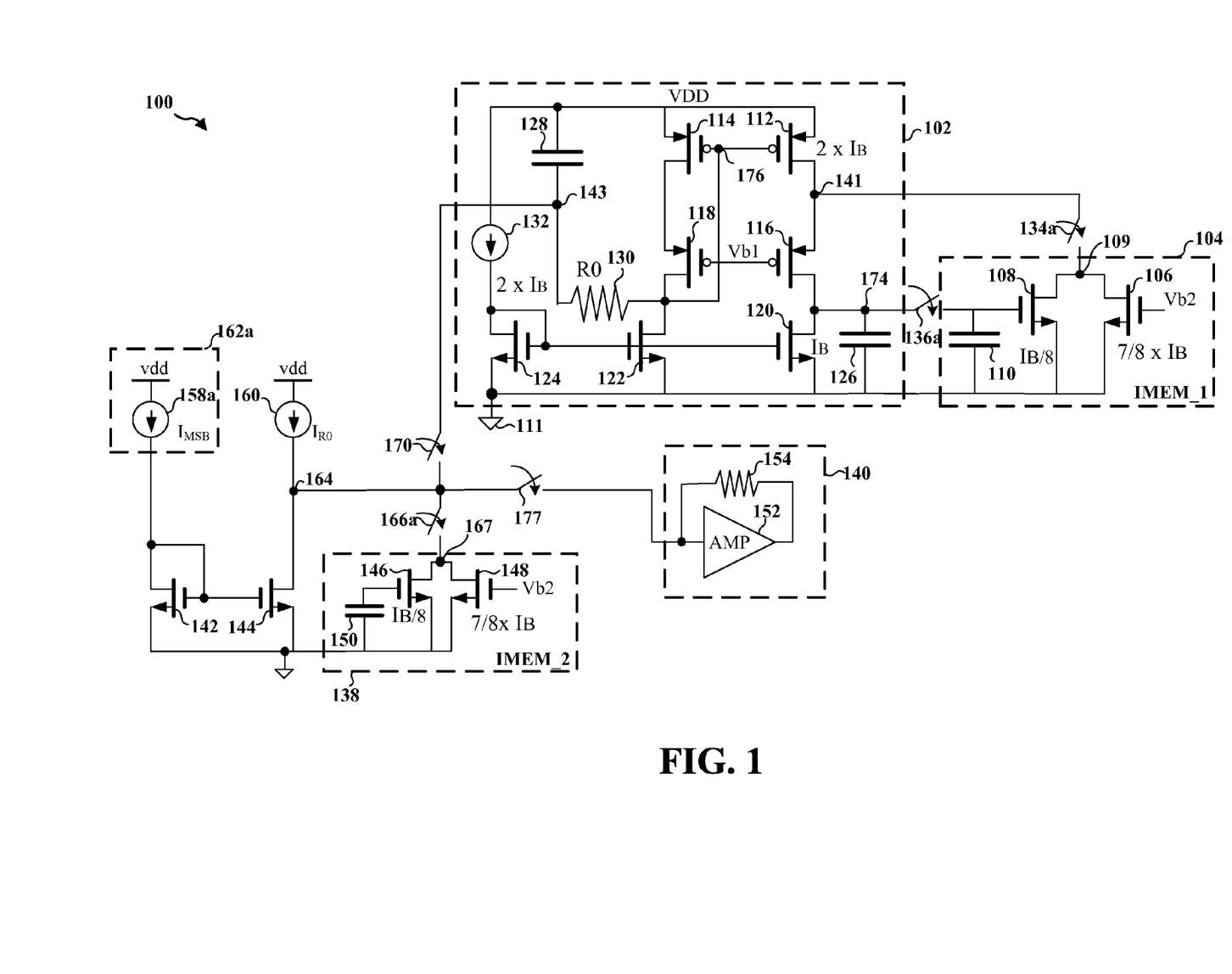
FIG. 1 is a diagram illustrating a DAC calibration circuit in accordance with various aspects of the disclosure.

FIG. 1 is a diagram illustrating a DAC calibration circuit 100 in accordance with various aspects of the disclosure. As shown in FIG. 1, DAC calibration circuit 100 includes memory cell (IMEM_1) 104, memory cell (IMEM_2) 138, charging circuit 102, and a current comparator circuit 140. In an aspect, charging circuit 102 includes transistors 112, 114, 116, 118, 120, 122, 124, capacitors 126 and 128, resistor (R0) 130, and current source 132.

In an aspect, memory cell 104 includes transistors 106 and 108 and capacitor 110. In one embodiment, transistors 106 and 108 may be configured to split the current between them such that the current is divided into $\frac{1}{8}^{th}$ and $\frac{7}{8}^{th}$ of the total current at node 109. The gate of transistor 106 is controlled by a bias Vb2 to enable the transistor 106 to conduct approximately $\frac{7}{8}^{th}$ the total current at node 109 in one embodiment. One terminal of capacitor 110 is connected to ground 111 and the other terminal of the capacitor 110 is connected to the gate of the transistor 108. A first terminal of transistor 108 is connected to the first terminal of the transistor 106 at node 109. The second terminals of both transistors 108 and 106 are connected to ground 111. In an aspect, memory cell 138 including transistors 146, 148 and capacitor 150 may be configured to operate in a manner similar to memory cell 104 as discussed infra.

In an aspect, switch 134a is closed to connect node 109 of memory cell 104 to node 141 of the charging circuit 102 to store a residual current error associated with current sources 158a and 160 in memory cell 104. For example, current source 158a may be a current source of a DAC element 162a that is calibrated with respect to a reference current source (e.g., current source 160). In an aspect, current source 158a may be calibrated for a DAC element and may provide current $I_{MSBC}$ (e.g., $I_{MSBC}=I_{MSB}+I_{CAL}$) and current source 160 may provide a reference current $I_{REF}$ (e.g., $I_{REF}=I_{R0}+I_{REFDAC}$).

In one aspect, succeeding DAC elements (also referred to as DAC bit elements) may each be coupled to transistor 142 to effect residual current error sampling and storing operations. In an aspect, each DAC bit element (e.g., DAC bit element 162a) may have its own current source (e.g., current source 158a). In such aspect, transistors 142, 144, source 160, and charging circuit 102 may be shared for all DAC bit elements (e.g., DAC bit elements 162a, 162b), such that each succeeding DAC bit element may be selectively coupled (e.g., via switches) to transistor 142 one at a time so that calibration may be performed. For example, a first DAC bit element may be coupled to the transistor 142 and calibration of the first DAC bit element may be performed. After calibration of the first DAC bit element is completed, the residual error of the calibration (e.g., the residual current error) is stored in IMEM_1 104 or IMEM_2 138. Thereafter, the first DAC bit element may be decoupled from the transistor 142 and a second DAC bit element (e.g., a succeeding DAC bit element) may be coupled to the transistor 142 in order to calibrate the second DAC bit element.

With reference to FIG. 1, before calibration of current source 158a of DAC bit element 162a, memory cell 104 may be used to store a dc current. The dc current may be a known fixed value or may be sampled.

In an aspect, charging circuit 102 may include nodes 141 and 143. In such aspect, in order to sample and store the residual current error between current sources 158a and 160 at node 164, switch 166a may connect node 164 to node 167, switch 170 may connect node 143 to node 164, switch 134a may connect node 109 to node 141, switch 136a may connect node 174 to the gate of transistor 108, and switch 177 may disconnect node 164 from comparator circuit 140. With such a configuration, the residual current error (e.g., $\Delta_1$) existing after calibration of current source 158a is provided from node 143 to node 176. The provision of the residual current error from node 143 charges capacitor 126 to a level that is approximately equal to the residual current error (e.g., $\Delta_1$). Capacitor 110 is charged via closed switch 136a to a similar level, thereby storing the residual current error (e.g., $\Delta_1$).

Figure 2:
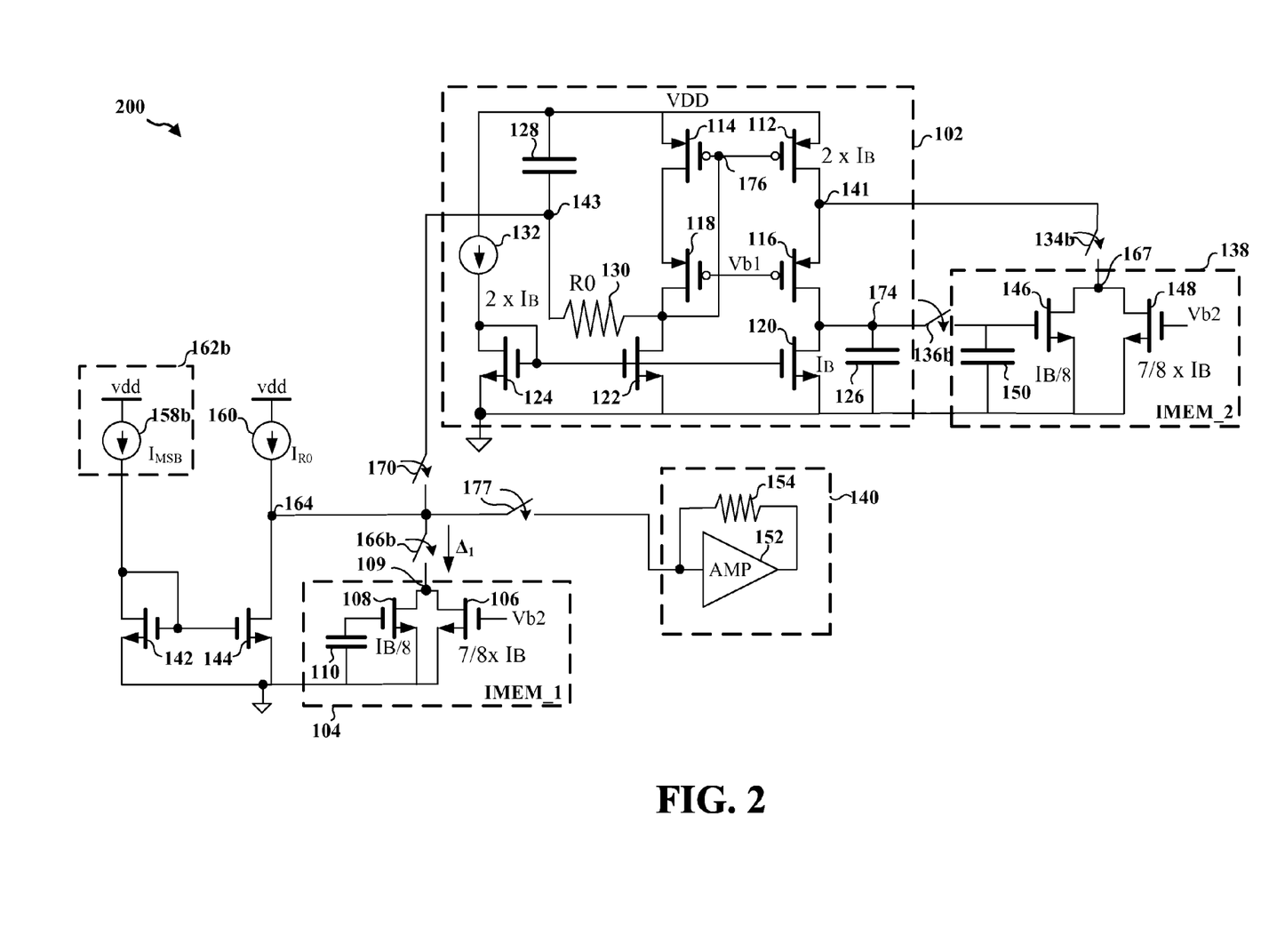
FIG. 2 is a diagram illustrating a DAC calibration circuit in accordance with various aspects of the disclosure.

FIG. 2 is a diagram illustrating a DAC calibration circuit 200 in accordance with various aspects of the disclosure. In an aspect, with reference to FIG. 2, when calibrating the current source 158b of a successive DAC bit element 162b, memory cell 104 (IMEM_1) may be coupled to the node 164. As previously discussed, memory cell 104 may be storing the residual current error (e.g., $\Delta_1$) from the calibration of a preceding DAC bit element 162a. Accordingly, in such aspect, switch 166b may couple node 109 to node 164, switch 170 may electrically disconnect node 164 from node 143, and switch 177 may couple node 164 to the input of the current comparator circuit 140. In such a configuration, capacitor 110 drives transistor 108 such that the memory cell 104 sinks an amount of current equal to the residual current error ($\Delta_1$) during calibration of the current source 158b of the DAC bit element 162b to improve accuracy of the calibration.

In an aspect, the current comparator circuit 140 may include one or more amplifiers, such as amplifier 152, which may be implemented using a feedback configuration (e.g., via resistor 154). In an aspect, the one or more amplifiers of the current comparator circuit 140 may be configured in one or more amplifier stages. In an aspect, the amplifier 152 may represent a first amplifier stage of the current comparator circuit 140. For example, the amplifier 152 may be a transimpedance amplifier (TIA). It should be understood that the current comparator circuit 140 may include additional circuitry (not shown for ease of illustration) for effectively performing a current comparator function. For example, the current comparator circuit 140 may be configured to convert a relatively small input current into an amount of voltage, and may amplify the amount of voltage for comparison.

It should be noted that calibration performed in the aspects described with respect to FIGS. 1 and 2 may not be accurate due to leakage current flow from the capacitors in the memory cells (e.g., capacitor 110 in memory cell 104). For example, with reference to FIG. 1, prior to the MSB calibration of DAC element 162a, the current comparator offset biasing current may be sampled by memory cell (I_MEM 1) 104. In the subsequent calibration of DAC element 162b, the memory cell (IMEM_1) 104 is used as a current comparator offset bias, as shown in the FIG. 2. However, the capacitor 110 may lose at least a portion of its stored charge through leakage currents via gate leakage or transistor S/D leakage. This is because the reference calibration may take a relatively long period of time (e.g., 40 μs) to complete. Such leakage current may result in a different comparator offset for each MSB DAC element, which may cause in erroneous calibration results.

The leakage currents may be especially large at nodes applying advanced technologies, such as 20 nm CMOS. For example, due to leakage current from the capacitor 110 in memory cell (IMEM_1) 104, the output current from the memory cell 104 may change by 16.9 nA during the reference calibration. In addition, various conditions (e.g., high temperatures and high voltage) may cause the output current of the memory cell (IMEM_1) 104 to drift as much as 347.1 nA. Such a large drift is output current may disturb the reference calibration and degrade the accuracy of subsequent MSB DAC element calibrations.

It should further be noted that a charge may be injected into the capacitor 110 of the memory cell 104 when switch 136a is opened after the residual current error has been sampled and stored by the capacitor 110. For example, with reference to FIG. 1, when sampling of the residual current error has been completed and the residual current error is stored in capacitor 110, switch 136a may be opened (e.g., turned off) and a portion of its channel charge may be injected into capacitor 110. Moreover, the charge injection and IMEM output steps for different MSB DAC elements may be different due to the MSB mismatch, which may result in different capacitor voltages. For example, the charge injection may cause an IMEM output step of 32.5 nA, which is about 1 CALDAC LSB. Such error is large enough to substantially degrade the sampling accuracy of the residual current error and, therefore, may reduce the effectiveness of the INL corrections.

As previously discussed with respect to FIGS. 1 and 2, during the MSB calibrations, the memory cell (IMEM_1) 104 and the memory cell (IMEM_2) 138 may be switched between the charging circuit 102 and the current comparator circuit 140. For example, with reference to FIG. 1, memory cell (IMEM_1) 104 may be coupled to the charging circuit 102 via switch 134a while the memory cell (IMEM_2) 138 may be coupled to the current comparator circuit 140 via switch 166a, subsequently, the memory cell (IMEM_1) 104 may be coupled to the current comparator circuit 140 via switch 166b while the memory cell (IMEM_2) 138 may be coupled to the charging circuit 102 via switch 134b. Such switching of the memory cell (IMEM_1) 104 and the memory cell (IMEM_2) 138 between the charging circuit 102 and the current comparator circuit 140 may be controlled to avoid sampling errors. For example, with reference to FIG. 1, after a residual current error has been sampled and stored in memory cell (IMEM_1) 104, switches 134a and 136a may both be opened (e.g., turned off). However, switch 136a should be opened before switch 134a. If switch 134a is opened while switch 136a is closed (e.g., turned on) the voltage on capacitor 110 may be effected resulting in calibration errors. For example, if switch 134a is opened prior to switch 136a, the voltage of the capacitor 110 may droop randomly. The voltage droop is random since it depends on the memory cell (IMEM_2) 138, which is coupled to the charging node. The droop will end only after switch 136a is opened, however, the sampled voltage in capacitor 110 is no longer accurate. As a result, random sampling errors of the residual current error may occur, which may accumulate in subsequent INL corrections, thereby degrading the accuracy of the INL calibrations.

Figure 3A:
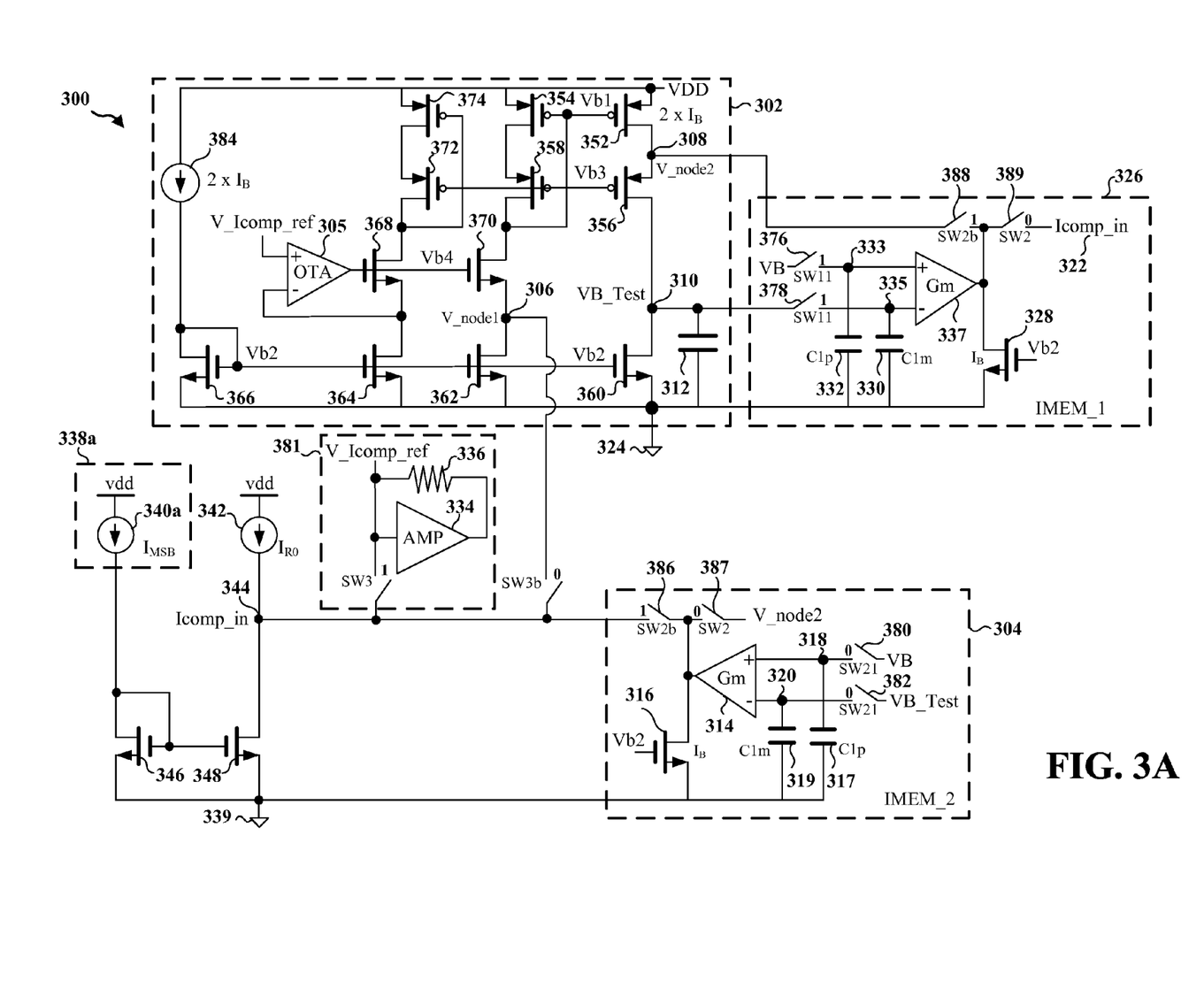
FIGS. 3A-3D are diagrams illustrating a DAC calibration circuit in accordance with various aspects of the disclosure.

FIG. 3A is a diagram illustrating a DAC calibration circuit 300 in accordance with various aspects of the disclosure. In an aspect, the DAC calibration circuit 300 may be implemented in a DAC device. As shown in FIG. 3A, DAC calibration circuit 300 includes charging circuit 302, memory cell (IMEM_1) 326, memory cell (IMEM_2) 304, current comparator circuit 381, and a DAC bit element 338a.

As shown in FIG. 3A, charging circuit 302 includes an operational transconductance amplifier (OTA) 305, transistors 352, 354, 356, 358, 360, 362, 364, 366, 368, 370, 372, 374, current source 384, and capacitor 312.

As further shown in FIG. 3A, memory cell (IMEM_1) 326 includes a differential amplifier 337, capacitors 330 and 332, and transistor 328. In an aspect, differential amplifier 337 may be a transconductance amplifier (Gm). In FIG. 3A, one terminal of capacitor 330 is coupled to ground 324 and the other terminal of capacitor 330 is coupled to a negative terminal of the transconductance amplifier 337 at node 335. One terminal of capacitor 332 is coupled to ground 324 and the other terminal of the capacitor 332 is coupled to a positive terminal of the transconductance amplifier 337 at node 333. A first terminal of transistor 328 is coupled to the output of transconductance amplifier 337 and a second terminal of transistor 328 is coupled to ground 324.

As further shown in FIG. 3A, memory cell (IMEM_2) 304 includes a differential amplifier 314, capacitors 317 and 319, and transistor 316. In an aspect, differential amplifier 314 may be a transconductance amplifier (Gm). As shown in FIG. 3A, one terminal of capacitor 317 is coupled to ground 339 and the other terminal of the capacitor 317 is coupled to a positive terminal of the transconductance amplifier 314 at node 318. As further shown in FIG. 3A, one terminal of capacitor 319 is coupled to ground 339 and the other terminal of the capacitor 319 is coupled to a negative terminal of the transconductance amplifier 314 at node 320. A first terminal of transistor 316 is coupled to the output of transconductance amplifier 314 and a second terminal of transistor 316 is coupled to ground 339.

In an aspect, the current comparator circuit 381 may include an amplifier 334, which may be configured with a feedback resistor (e.g., resistor 336). For example, the current comparator circuit 381 may be configured to convert a relatively small input current into an amount of voltage, and may amplify the amount of voltage for comparison.

With reference to the memory cell (IMEM_1) 326, the positive terminal of the transconductance amplifier 337 is coupled to fixed voltage VB via switch SW11 376 and the negative terminal of the transconductance amplifier 337 is coupled to node 310 of the charging circuit 302 via switch SW11 378. In the configurations of FIGS. 3A-3D, it should be understood that a logic value "1" next to a switch indicates that the switch is closed (e.g., turned on) and a logic value "0" next to a switch indicates that the switch is open (e.g., turned off). In an aspect, the fixed voltage VB may be internally generated by the DAC calibration circuit 300. In an aspect, when node 306 is not electrically connected to the current comparator circuit 381 (e.g., when the switch SW3b is open), the memory cell (IMEM_1) 326 may sample a DC current flowing through node 310, which is approximately equal to the current $I_B$ and used for calibrating the initial DAC bit element (e.g., DAC bit element 338a).

In an aspect, prior to performing a calibration operation for an initial DAC bit element (e.g., DAC bit element 338a), the memory cell (IMEM_1) 326 may store a DC current in the form of an electric charge using capacitors 330 and 332. In an aspect, the DC current may be a known fixed value or may be sampled. Due to the differential configuration of the memory cell (IMEM_1) 326, the current leakage of capacitors 330 and 332 generates a common-mode voltage drift, which may not change the output current of the memory cell (IMEM_1) 326. Therefore, despite any current leakage of the capacitors 330 and 332, the output current drift of the memory cell (IMEM_1) 326 may be relatively low (e.g., 3.6 nA). Moreover, the previously discussed charge injection issues may also be improved in memory cell (IMEM_1) 326. For example, a jump in output current of the memory cell (IMEM_1) 326 due to the charge injection caused by opening of the switch SW11 378 may be reduced to 0.6 nA.

Figure 3B:
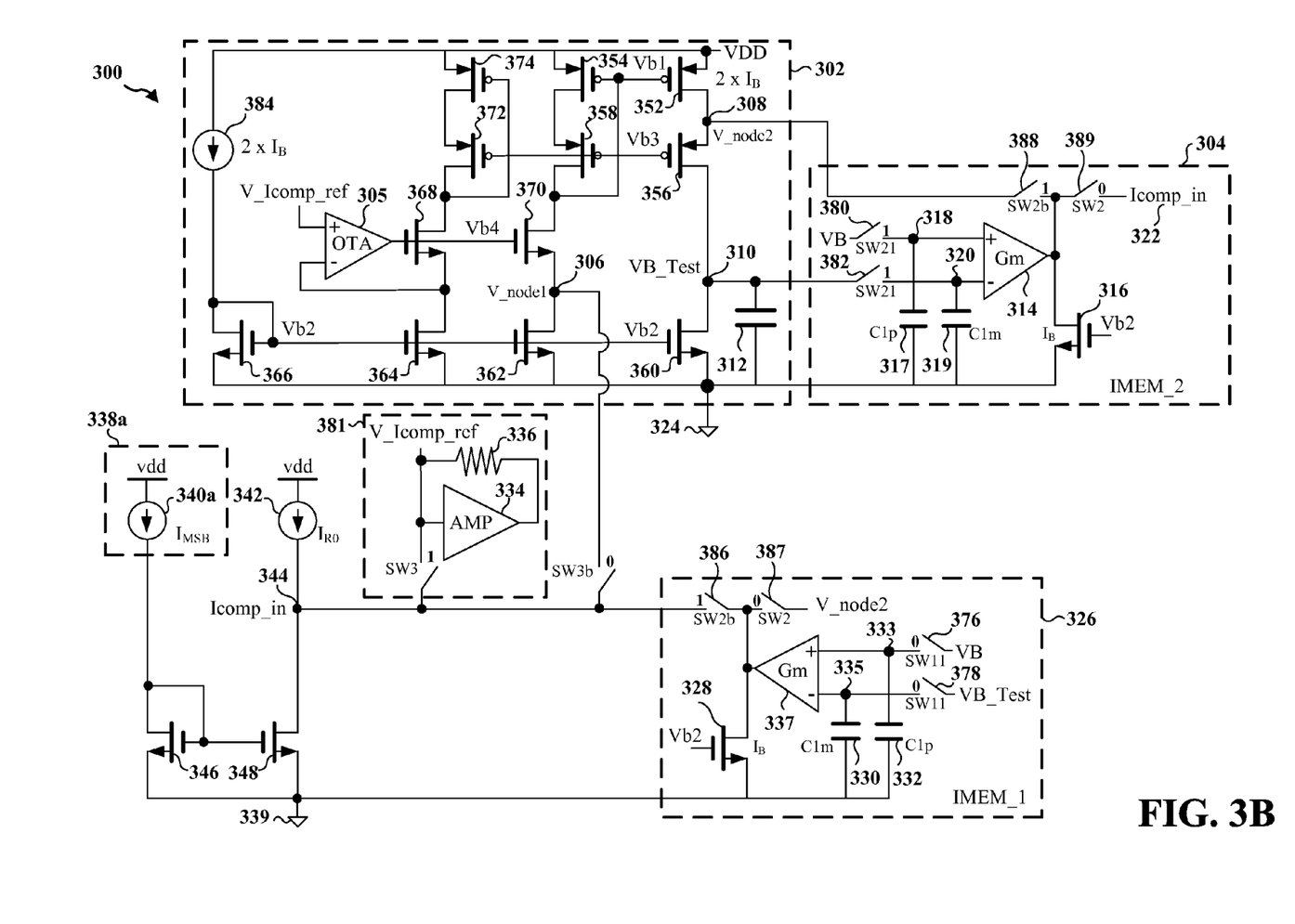

In an aspect, with reference to FIG. 3B, the memory cell (IMEM_1) 326 may be coupled to the current comparator circuit 381 and node 344, while the memory cell (IMEM_2) 304 may be coupled to the charging circuit 302. For example, the DAC calibration circuit 300 may close (e.g., turn on) switches SW3, SW2b 386, SW2b 388, SW21 380, and SW21 382, and may open (e.g., turn off) switches SW3b, SW2 387, SW2 389, SW11 376, and SW11 378 to perform calibration of DAC bit element 338a using the current comparator circuit 381. It should be noted that the memory cell (IMEM_1) 326 may be storing an electric charge due to a DC current in capacitor 330 and a fixed voltage (VB) in capacitor 332 as previously described with respect to FIG. 3A. The differential amplifier 337 may output an amount of current based on the difference between the electric charge stored in capacitor 330 and the fixed voltage (VB) stored in capacitor 332 to improve accuracy of the calibration of the current source 340a of DAC bit element 338a. For example, current source 340a may be a current source of the DAC bit element 338a and may be calibrated with respect to a reference current source (e.g., current source 342) using the current comparator circuit 381.

Figure 3C:
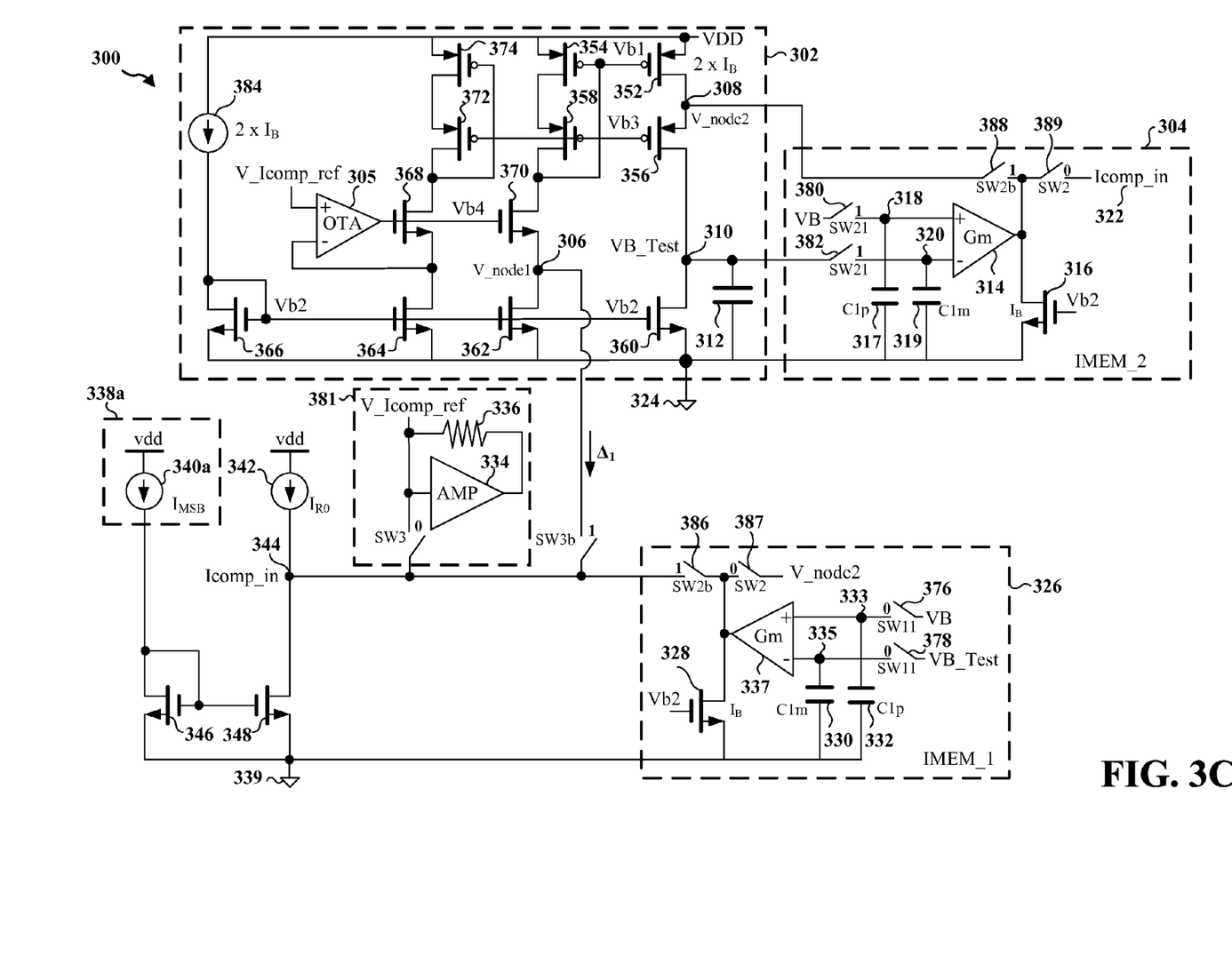
Figure 3D:
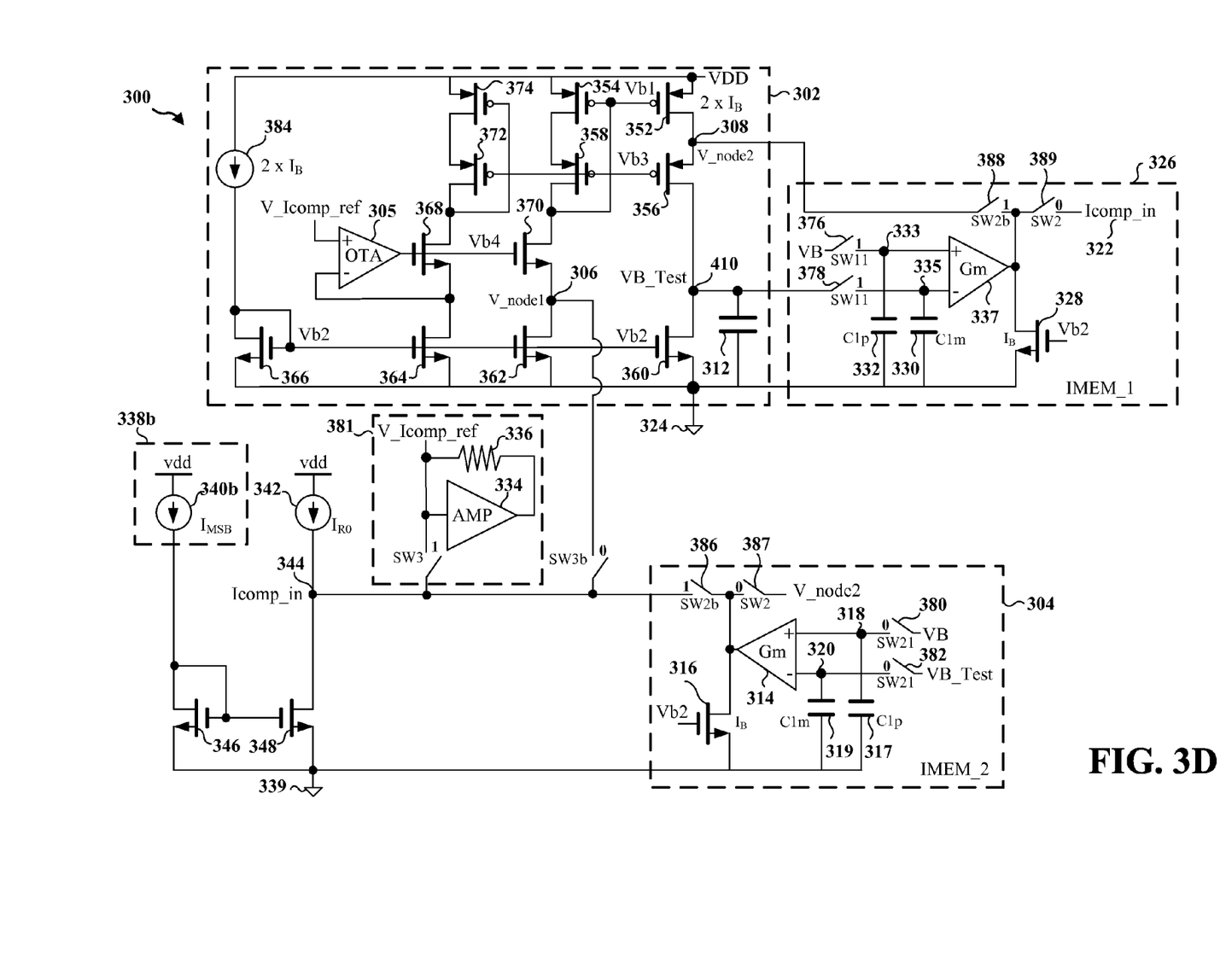

In an aspect, as shown in FIG. 3C, charging circuit 302 may include nodes 306 and 308. As further shown in FIG. 3C, the operational transconductance amplifier (OTA) 305 may be used as a replica bias, so that the voltage of node 306 (V_node 1) tracks the voltage of the current comparator input (V_Icomp_ref). In such aspect, in order for the memory cell (IMEM_2) 304 to sample and store the residual current error between current sources 340a and 342 at node 344, the DAC calibration circuit 300 may close (e.g., turn on) switch SW3b to couple node 306 to node 344, close (e.g., turn on) switch SW2b 386 to couple nodes 344 and 306 to the output of the differential amplifier 337, close (e.g., turn on) switch SW2b 388 to couple node 308 to the output of the differential amplifier 314, close (e.g., turn on) switch SW21 382 to couple node 310 to node 320, and close (e.g., turn on) switch SW21 380 to couple node 318 to the fixed voltage VB. With such a configuration, the residual current error (e.g., $\Delta_1$) existing after calibration of current source 340a is provided from node 306 to node 308. The provision of the residual current error from node 306 charges capacitor 312 to a voltage level corresponding to the residual current error (e.g., $\Delta_1$). Capacitor 319 is charged via closed switch SW21 382 to a similar voltage level, thereby enabling memory cell (IMEM_2) 304 to store the residual current error (e.g., $\Delta_1$) associated with DAC bit element 338a.

In one embodiment, succeeding DAC elements (also referred to as DAC bit elements) may each be coupled to transistor 346 to effect residual current error sampling and storing operations for each succeeding DAC bit element. For example, with reference to FIG. 3D, when calibrating the current source 340b of a successive DAC bit element 338b, the memory cells 304 and 326 are switched so that memory cell (IMEM_2) 304 is coupled to the current comparator circuit 381 and the memory cell (IMEM_1) 326 is coupled to the charging circuit 302. Therefore, the differential amplifier 314 may output an amount of current based on the difference between the residual current error (e.g., $\Delta_1$) of the previous calibration stored in capacitor 319 and the fixed voltage (VB) in capacitor 317, where the amount of current output by the differential amplifier 314 serves as an offset bias of the current comparator circuit 381 to improve accuracy of the calibration of the current source 340b of the successive DAC bit element 338b.

Figure 4:
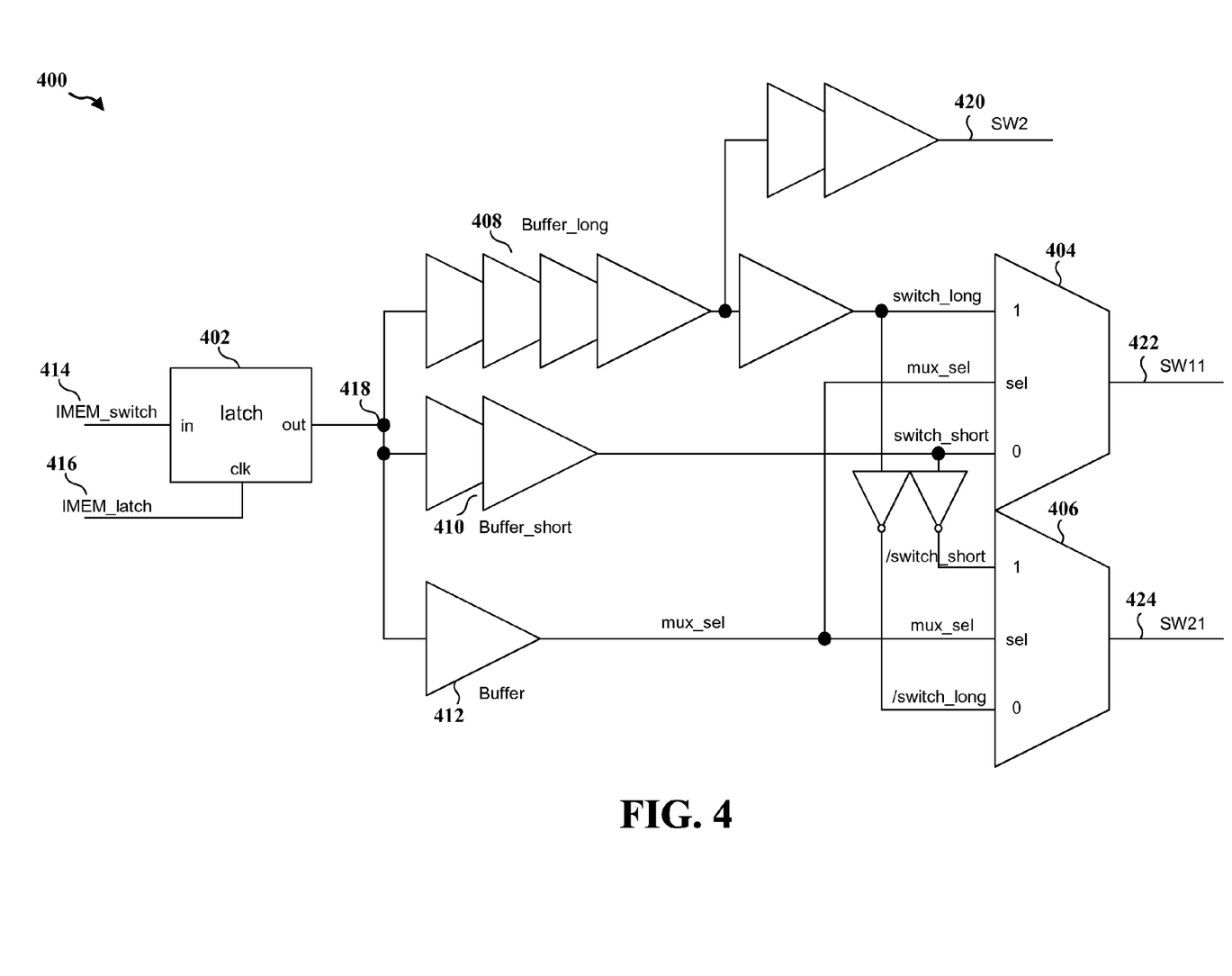
FIG. 4 is a diagram illustrating a control signal generator for a DAC calibration circuit in accordance with various aspects of the disclosure.

FIG. 4 is a diagram illustrating a control signal generator 400 in accordance with various embodiments of the disclosure. As shown in FIG. 4, control signal generator 400 includes latch 402, long buffer 408, short buffer 410, buffer 412, and multiplexers 404 and 406. As shown in FIG. 4, an IMEM latch signal 416 is applied to the clock ("clk") input of the latch 402 and an IMEM switch signal 414 is applied to the input ("in") of the latch 402. As further shown in FIG. 4, the output ("out") of the latch 402 is provided to the input of the long buffer 408, short buffer 410, and buffer 412 at node 418. In an aspect, and as discussed infra with respect to FIG. 5, the signals generated by the control signal generator 400 may be used to control corresponding switches in FIGS. 3A-3D (e.g., to minimize switching glitches that may degrade the sampling and storing performance of the memory cells (e.g., memory cells 304 and 326)). For example, the signal SW2 420 may be used to control switches SW2 387, 389, the signal SW11 422 may be used to control switches SW2 376, 378, and the signal SW21 424 may be used to control switches SW21 380, 382.

Figure 5:
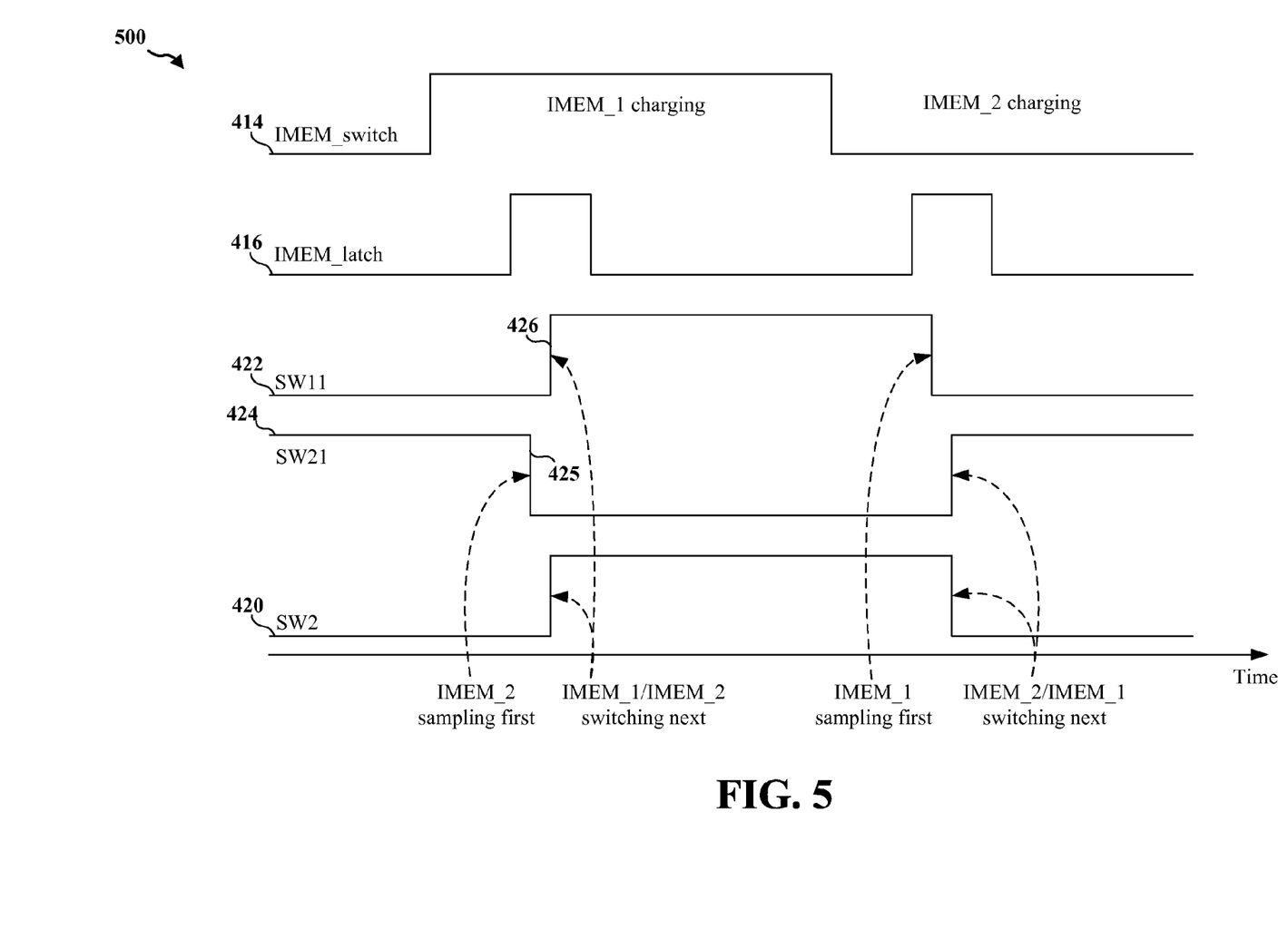
FIG. 5 is a diagram illustrating control signal timing in accordance with various aspects of the disclosure.

With reference to the control signal diagram 500 of FIG. 5, the latch 402 may re-time the IMEM switch signal 414 based on the IMEM latch signal 416. The output of the latch 402 drives the long delay buffer 408 and the short delay buffer 410. Depending on the value of the IMEM switch signal 414 (e.g., logic "1" or logic "0"), a multiplexer (e.g., multiplexer 404, 406) is used to select either a long delay or a short delay to control the IMEM sampling switch. For example, if the IMEM switch 414 is switched from 1'b0 to 1'b1: memory cell (IMEM_2) 304 is coupled to the charging circuit 302 and memory cell (IMEM_1) 326 is coupled to the current comparator circuit 381. In this case, SW21 signal 424 is generated from the short delay path (e.g., via short delay buffer 410) and SW11 signal 422 is generated from the long delay path (e.g., via long delay buffer 408). In an aspect, the SW2 signal 420 is always generated from the long delay path. Therefore, the sampling performed by memory cell (IMEM_2) 304 may be completed prior to any voltage disturbance caused by SW2 signal 420. Similarly, if IMEM switch signal 414 is switched from 1'b1 to 1'b0: the SW11 signal 422 is generated from the short delay path, thereby allowing the sampling performed by the memory cell (IMEM_1) 326 to be completed before a disturbance due to switching (e.g., switching of switches SW11 376, 378 in response to the SW11 signal 422 and/or switch SW2 in response to SW2 signal 420) occurs. For example, the time (e.g., delay) between non-overlapping edges of SW11 signal 422 and SW21 signal 424 (e.g., edge 426 of SW11 signal 422 and edge 425 of SW21 signal 424) may be based on the delay difference between the long delay buffer 408 and short delay buffer 410, which may be approximately 200 ps. Therefore, the control signal generator 400 may be configured to provide an adequate delay between the edges of SW11 signal 422 and SW21 signal 424 without disturbing normal operations.

Figure 6:
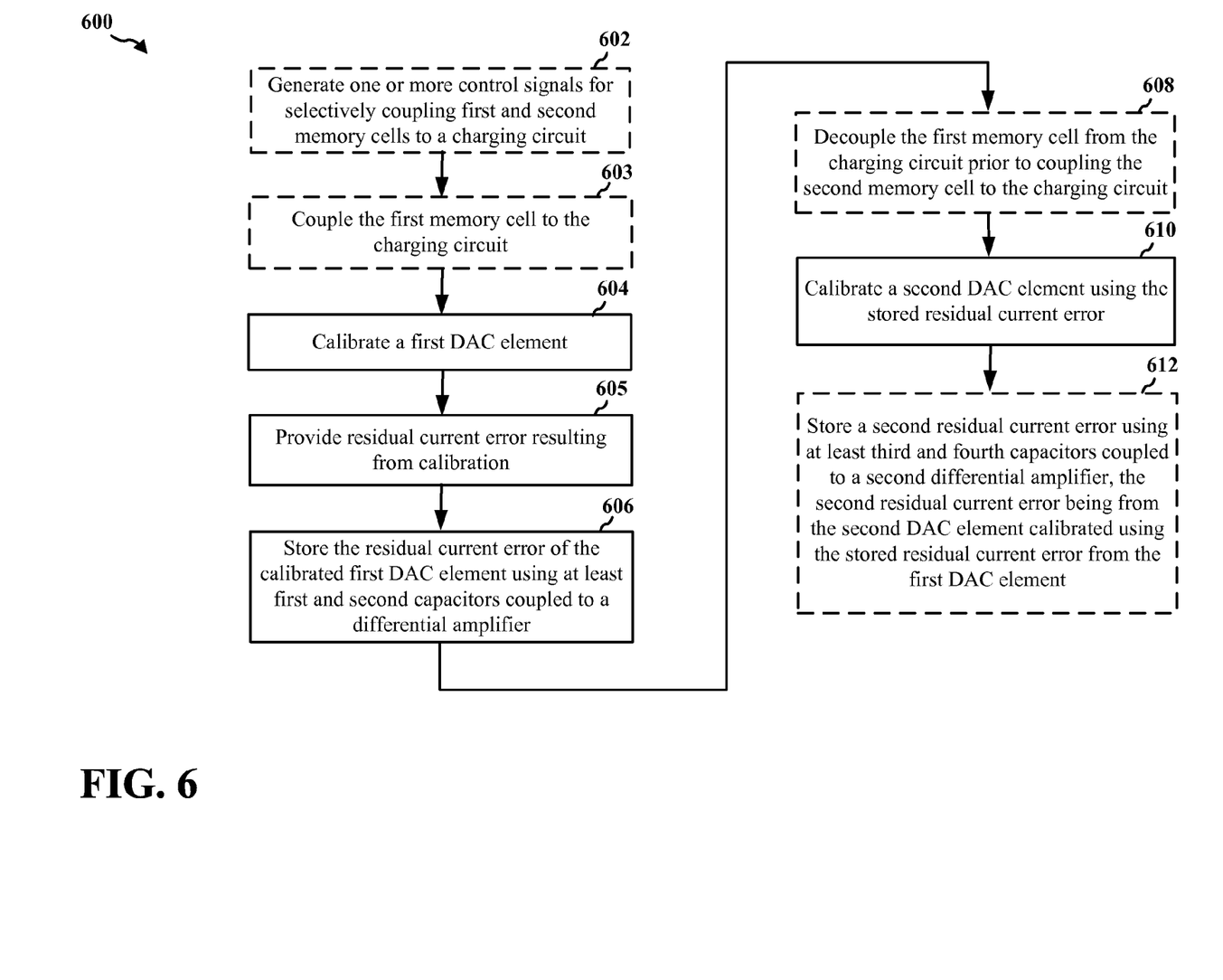
FIG. 6 is a flow chart of a method of calibrating a DAC in accordance with various aspects of the disclosure.

FIG. 6 is a flow chart 600 of a method of calibrating a DAC in accordance with various aspects of the disclosure. For example, the method may be performed by a DAC calibration circuit in a DAC device. In flow chart 600, steps represented with dotted lines represent optional steps. At step 602, the DAC calibration circuit generates one or more control signals for selectively coupling first and second memory cells to a charging circuit. At step 603, the DAC calibration circuit couples the first memory cell (also referred to as a first storage module) to the charging circuit. At step 604, the DAC calibration circuit calibrates a first DAC element. At step 605, the DAC calibration circuit provides a residual current error resulting from the calibration, the residual current error being a difference between a calibrated current source of the first DAC element and a reference current source. At step 606, the DAC calibration circuit stores the residual current error of the calibrated first DAC element using at least first and second capacitors coupled to a differential amplifier. At step 608, the DAC calibration circuit decouples the first memory cell from the charging circuit prior to coupling the second memory cell (also referred to as a second storage module) to the charging circuit. At step 610, the DAC calibration circuit calibrates a second DAC element using the stored residual current error. At step 612, the DAC calibration circuit stores a second residual current error using at least third and fourth capacitors coupled to a second differential amplifier, the second residual current error being from the second DAC element calibrated using the stored residual current error from the first DAC element.

Figure 7:
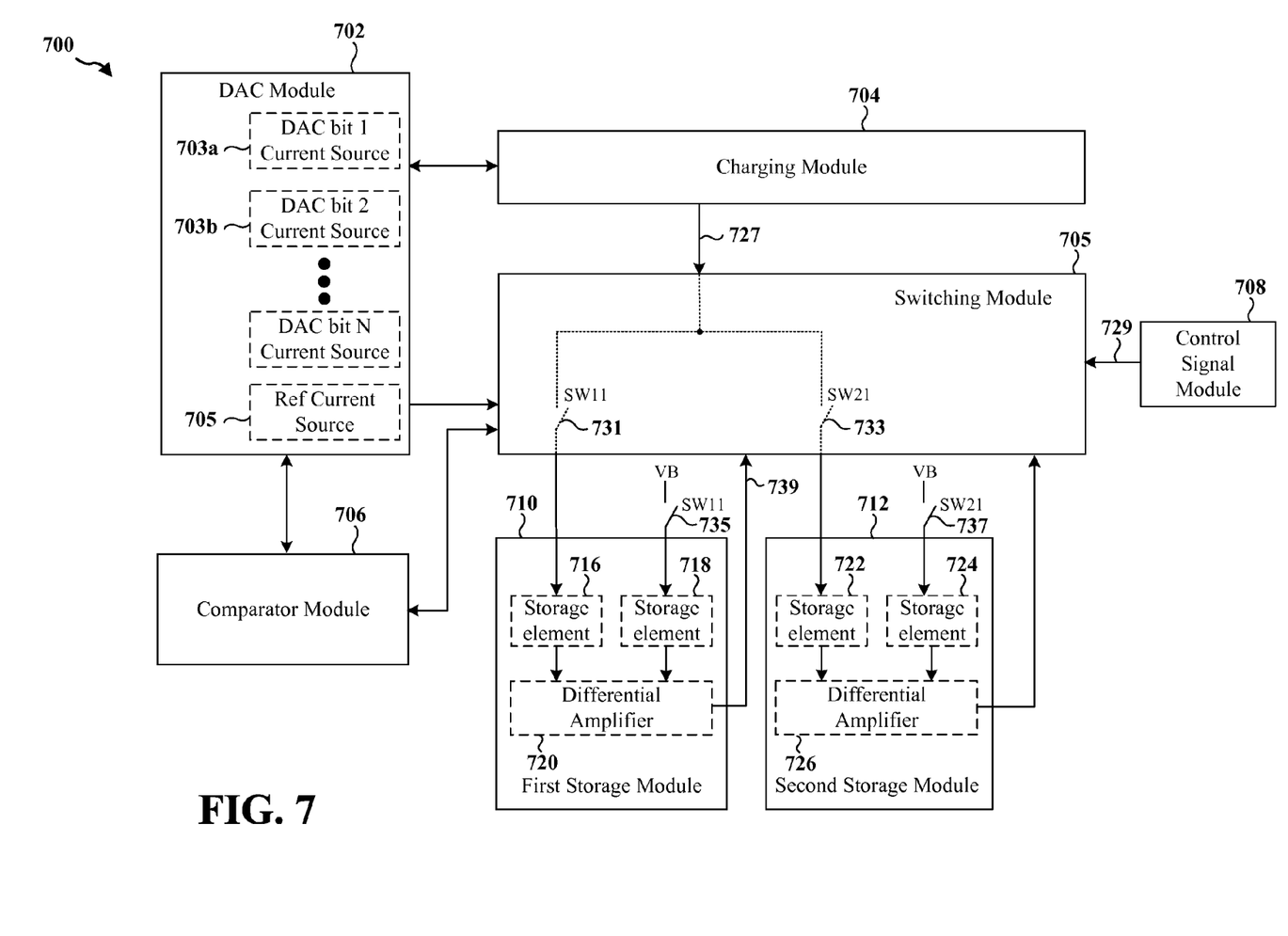
FIG. 7 is a block diagram of a DAC in accordance with various aspects of the disclosure.

FIG. 7 is a block diagram of a DAC 700 in accordance with various aspects of the disclosure. As shown in FIG. 7, DAC 700 includes DAC module 702, charging module 704, switching module 705, comparator module 706, control signal module 708, first storage module 710, and second storage module 712. As further shown in FIG. 7, first storage module 710 may include first storage element 716, second storage element 718, and differential amplifier 720. The second storage module 712 may include third storage element 722, fourth storage element 724, and differential amplifier 726. In an aspect, each of the storage elements may be implemented as a capacitor.

In an aspect, the comparator module 706 calibrates a current source of a preceding DAC bit element (e.g., current source 703a of DAC bit 1) of the DAC module 702. The charging module may sample and store a residual current error (e.g., Δ1) resulting from the calibration, where the residual current error is the difference between the calibrated current source of the preceding DAC bit element (e.g., current source 703a of DAC bit 1) of the DAC module 702 and the reference current source 705. The charging module 704 provides the residual current error (e.g., via output 727) to the first storage module 710 via switching module 705. In an aspect, the control signal module 708 generates one or more control signals for selectively coupling the first and second storage modules 710, 712 to the charging module 704. In an aspect, the control signal module 708 may provide a control signal 729 to the switching module 705, the control signals 729 causing the switches SW11 731, 735 to close and switches SW21 733, 737 to open.

For example, in one aspect, control signal module 708 may be configured to include the control signal generator 400 of FIG. 4 and may generate the signals SW11 422 and SW21 424 as shown in FIG. 5. It should be noted that control signal module 708 may prevent the first and second storage modules 710, 712 from being concurrently coupled to the charging module 704. For example, the control signal module 708 may open switches SW21 733, 737 (e.g., second storage module 712 is decoupled from charging module 704) prior to closing switches SW11 731, 735. As shown in FIG. 7, the residual current error (e.g., output 727 from the charging module 704) may be stored in first storage element 716 and a fixed voltage (e.g., voltage VB) may be stored in second storage element 718. The current leakage of the first storage element 716 and second storage element 718 generates a common-mode voltage drift, which may not change the output current (e.g., output current of the differential amplifier 720) of the first storage module 710. The control signal module 708 may then open switches SW11 731, 735 (e.g., first storage module 710 is decoupled from charging module 704) prior to closing switches SW21 733, 737 to couple the second storage module 712 to the charging module 704.

The comparator module 706 then calibrates a current source of a subsequent DAC bit element (e.g., current source 703b of DAC bit 2) of the DAC module 702 using the residual current error 739 from the first storage module 710. The charging module 704 may sample and store a second residual current error resulting from the calibration, where the second residual current error is the difference between the calibrated current source of the subsequent DAC bit element (e.g., current source 703b of DAC bit 2) of the DAC module 702 and the reference current source 705. The charging module 704 provides the second residual current error (e.g., via output 727) to the second storage module 712 via switching module 705. In an aspect, the control signal module 708 may provide control signals 729 to the switching module 705, the control signals 729 causing the switches SW11 731, 735 to open and switches SW21 733, 737 to close. The second residual current error may be stored in third storage element 722 and a fixed voltage (e.g., voltage VB) may be stored in fourth storage element 724. The current leakage of the third storage element 722 and fourth storage element 724 generates a common-mode voltage drift, which may not change the output current (e.g., output current of the differential amplifier 726) of the second storage module 712.

In an aspect, an apparatus for calibrating a DAC includes means for calibrating a first DAC element. For example, the means for calibrating the first DAC element may be the current comparator circuit 381. As another example, the means for calibrating the first DAC element may be the comparator module 706. The apparatus for calibrating a DAC further includes means for providing a residual current error resulting from the calibration, the residual current error being a difference between a calibrated current source of the first DAC element and a reference current source. For example, the means for providing the residual current error resulting from the calibration may be the charging circuit 302. As another example, the means for providing the residual current error resulting from the calibration may be the charging module 704. The apparatus for calibrating a DAC further includes means for storing the residual current error of the calibrated first DAC element using at least first and second storage elements coupled to a differential amplifier. For example, means for storing the residual current error of the calibrated first DAC element may be the memory cell (IMEM_1) 326. As another example, the means for storing the residual current error of the calibrated first DAC element may be first storage module 710. The apparatus for calibrating a DAC further includes means for calibrating a second DAC element using the stored residual current error. For example, the means for calibrating a second DAC element using the stored residual current error may be the current comparator circuit 381. As another example, the means for calibrating a second DAC element using the stored residual current error may be the comparator module 706. The apparatus for calibrating a DAC further includes means for storing a second residual current error using at least third and fourth capacitors coupled to a second differential amplifier, the second residual current error being from the second DAC element calibrated using the residual current error from the first DAC element. For example, the means for storing a second residual current error using at least third and fourth capacitors coupled to a second differential amplifier may be the memory cell (IMEM_2) 304. As another example, the means for storing a second residual current error using at least third and fourth capacitors coupled to a second differential amplifier may be second storage module 712. The apparatus for calibrating a DAC further includes means for generating one or more control signals for selectively coupling the means for storing the residual current error and the means for storing the second residual current error to the charging module. For example, the means for generating one or more control signals for selectively coupling the means for storing the residual current error and the means for storing the second residual current error to the charging module may be the control signal generator 400. As another example, the means for generating one or more control signals for selectively coupling the means for storing the residual current error and the means for storing the second residual current error to the charging module may be the control signal module 708.

It is understood that the specific order or hierarchy of steps in the processes/flow charts disclosed is an illustration of exemplary approaches. Based upon design preferences, it is understood that the specific order or hierarchy of steps in the processes/flow charts may be rearranged. Further, some steps may be combined or omitted. The accompanying method claims present elements of the various steps in a sample order, and are not meant to be limited to the specific order or hierarchy presented.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." The word "exemplary" is used herein to mean "serving as an example, instance, or illustration." Any aspect described herein as "exemplary" is not necessarily to be construed as preferred or advantageous over other aspects." Unless specifically stated otherwise, the term "some" refers to one or more. Combinations such as "at least one of A, B, or C," "at least one of A, B, and C," and "A, B, C, or any combination thereof" include any combination of A, B, and/or C, and may include multiples of A, multiples of B, or multiples of C. Specifically, combinations such as "at least one of A, B, or C," "at least one of A, B, and C," and "A, B, C, or any combination thereof" may be A only, B only, C only, A and B, A and C, B and C, or A and B and C, where any such combinations may contain one or more member or members of A, B, or C. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed as a means plus function unless the element is expressly recited using the phrase "means for."

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FAGAN) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EPSOM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASICS. The ASICS may reside in a user terminal. In the alternative, the processor and the storage medium may reside as discrete components in a user terminal.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A nontransitory storage media may be any available media that can be accessed by a computer. By way of example, and not limitation, such nontransitory computer-readable storage media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

The previous description of the disclosed embodiments is provided to enable any person skilled in the art to make or use the present disclosure. Various modifications to these embodiments will be readily apparent to those skilled in the art, and the generic principles defined herein may be applied to other embodiments without departing from the spirit or scope of the disclosure. Thus, the present disclosure is not intended to be limited to the embodiments shown herein but is to be accorded the widest scope consistent with the principles and novel features disclosed herein.

What is claimed is:

1. An apparatus for calibrating a digital-to-analog converter (DAC), comprising:
   a current comparator module configured to calibrate a first DAC element;
   a charging module configured to provide a residual current error resulting from the calibration, the residual current error being a difference between a calibrated current source of the first DAC element and a reference current source; and a first memory module comprising at least first and second storage elements coupled to a differential amplifier, the first memory module configured to store the residual current error using the at least first and second storage elements and to provide the stored residual current error for calibration of a second DAC element.

2. The apparatus of claim 1, wherein the residual current error is stored in the charging module.

3. The apparatus of claim 1, wherein the first storage element is a first capacitor and the second storage element is a second capacitor, wherein the first and second capacitors are respectively coupled to first and second inputs of the differential amplifier, and wherein the first capacitor is configured to store the residual current error and the second capacitor is configured to store a fixed voltage.

4. The apparatus of claim 3, further comprising a second memory module that includes at least third and fourth differential capacitors and a second differential amplifier, wherein the at least third and fourth differential capacitors are respectively coupled to first and second inputs of the differential amplifier, and wherein the third capacitor is configured to store a second residual current error from the second DAC element calibrated using the residual current error from the first DAC element and the fourth capacitor is configured to store the fixed voltage.

5. The apparatus of claim 4, further comprising a control signal module configured to generate one or more control signals for selectively coupling the first and second memory modules to the charging module.

6. The apparatus of claim 5, wherein the one or more control signals are configured to couple the first memory module to the charging module to enable storage of the residual current error and to decouple the first memory module from the charging module prior to coupling the second memory module to the charging module.

7. The apparatus of claim 4, wherein the one or more control signals are configured to prevent the first and second memory modules from being concurrently coupled to the charging module.

8. A method of calibrating a digital-to-analog converter (DAC), comprising:
calibrating a first DAC element;
providing a residual current error resulting from the calibration, the residual current error being a difference between a calibrated current source of the first DAC element and a reference current source;
storing the residual current error of the calibrated first DAC element in a first memory module using at least first and second storage elements coupled to a differential amplifier; and
calibrating a second DAC element using the stored residual current error.

9. The method of claim 8, wherein the residual current error is provided by a charging module.

10. The method of claim 8, wherein the first storage element is a first capacitor and the second storage element is a second capacitor, and wherein the storing the residual current error comprises storing the residual current error in the first capacitor and storing a fixed voltage in the second capacitor.

11. The method of claim 10, further comprising storing a second residual current error in a second memory module using at least third and fourth capacitors coupled to a second differential amplifier, the second residual current error being from the second DAC element calibrated using the residual current error from the first DAC element.

12. The method of claim 11, wherein the storing the second residual current error comprises:
storing the second residual current error from the second DAC element in the third capacitor of the second memory module; and
storing the fixed voltage in the fourth capacitor of the second memory module.

13. The method of claim 12, further comprising generating one or more control signals for selectively coupling the first and second memory modules to the charging module.

14. The method of claim 13, further comprising:
coupling the first memory module to the charging module to enable storage of the residual current error; and
decoupling the first memory module from the charging module prior to coupling the second memory module to the charging module.

15. The method of claim 12, further comprising preventing the first and second memory modules from being concurrently coupled to the charging module.

16. An apparatus for calibrating a digital-to-analog converter (DAC), comprising:
means for calibrating a first DAC element;
means for providing a residual current error resulting from the calibration, the residual current error being a difference between a calibrated current source of the first DAC element and a reference current source;
means for storing the residual current error of the calibrated first DAC element using at least first and second storage elements coupled to a differential amplifier; and
means for calibrating a second DAC element using the stored residual current error.

17. The apparatus of claim 16, wherein the first storage element is a first capacitor and the second storage element is a second capacitor, and wherein the means for storing the residual current error is configured to store the residual current error in the first capacitor and store a fixed voltage in the second capacitor.

18. The apparatus of claim 17, further comprising means for storing a second residual current error using at least third and fourth capacitors coupled to a second differential amplifier, the second residual current error being from the second DAC element calibrated using the residual current error from the first DAC element.

19. The apparatus of claim 18, wherein the means for storing the second residual current error is configured to:
store the second residual current error from the second DAC element in the third capacitor; and
store the fixed voltage in the fourth capacitor.

20. The apparatus of claim 19, further comprising means for generating one or more control signals for selectively coupling the means for storing the residual current error and the means for storing the second residual current error to the charging module.

21. The apparatus of claim 20, wherein the means for generating the one or more control signals is configured to:
couple the means for storing the residual current error to the charging module to enable storage of the residual current error; and
decouple the means for storing the residual current error from the charging module prior to coupling the means for storing the second residual current error to the charging module.

22. The apparatus of claim 19, wherein the means for generating the one or more control signals is configured to prevent the means for storing the residual current error and the means for storing the second residual current error from being concurrently coupled to the charging module.

\* \* \* \* \*